US005862082A

United States Patent [19]

Dejenfelt et al.

[11] Patent Number: 5,862,082

[45] Date of Patent: Jan. 19, 1999

[54] TWO TRANSISTOR FLASH EEPROM CELL AND METHOD OF OPERATING SAME

[75] Inventors: Anders T. Dejenfelt, San Jose; Diane M. Hoffstetter, Sunnyvale; Qi Lin, Cupertino; Robert A. Olah, Palo Alto; Sholeh Diba, Los Gatos, all of Calif.

[73] Assignee: Xilinx, Inc., San Jose, Calif.

[21] Appl. No.: 62,008

[22] Filed: Apr. 16, 1998

[51] Int. Cl.[6] .................. G11C 13/00

[52] U.S. Cl. .................. 365/185.33; 365/185.28

[58] Field of Search .................. 365/185.33, 218, 365/185.28

[56] References Cited

U.S. PATENT DOCUMENTS

| | | | |
|---|---|---|---|
| 3,986,054 | 10/1976 | Hansen et al. | 307/270 |
| 4,577,295 | 3/1986 | Eitan et al. | 365/218 |
| 4,698,787 | 10/1987 | Mukherjee et al. | 365/185 |
| 5,162,680 | 11/1992 | Norman et al. | 307/530 |
| 5,218,568 | 6/1993 | Lin et al. | 365/185 |
| 5,313,427 | 5/1994 | Schreck et al. | 365/208 |
| 5,329,487 | 7/1994 | Gupta et al. | 365/185 |
| 5,379,253 | 1/1995 | Bergemont | 365/185 |
| 5,432,740 | 7/1995 | D'Arrigo et al. | 365/185 |
| 5,453,388 | 9/1995 | Chen et al. | 437/30 |
| 5,471,422 | 11/1995 | Chang et al. | 365/185 |
| 5,530,384 | 6/1996 | Lee et al. | 327/51 |
| 5,559,735 | 9/1996 | Ono et al. | 365/185 |
| 5,563,827 | 10/1996 | Lee et al. | 365/184 |
| 5,631,583 | 5/1997 | Lee et al. | 327/51 |
| 5,687,118 | 11/1997 | Chang | 365/185 |

FOREIGN PATENT DOCUMENTS

| | | |
|---|---|---|
| 0 079 636 A | 5/1983 | European Pat. Off. . |
| 2 200 265 | 7/1988 | United Kingdom . |

OTHER PUBLICATIONS

D. Bursky, "Flash EEPROM Takes Changes in Place by Cutting Programming Signal to 5V", Electronic Design, vol. 37, No. 23, 9 Nov. 1989, p. 30.

*Primary Examiner*—Terrell W. Fears
*Attorney, Agent, or Firm*—E. Eric Hoffman; Jeanette S. Harms

[57] ABSTRACT

A flash electrically erasable programmable read only memory (EEPROM) cell fabricated in a semiconductor substrate. A first well region having a first conductivity type is located in the semiconductor substrate. A second well region having a second conductivity type, opposite the first conductivity type, is located in the first well region. A non-volatile memory transistor and an independently controllable access transistor are fabricated in the second well region. The non-volatile memory transistor and the access transistor are connected in series, such that the source of the access transistor is coupled to the drain of the non-volatile memory transistor. The first well region, the second well region, the non-volatile memory transistor and the access transistor are biased such that electrons are transferred from the first well region to a floating gate of the non-volatile memory transistor by Fowler-Nordheim tunneling during an erase mode, and electrons are transferred from the floating gate of the non-volatile memory transistor through the access transistor by Fowler-Nordheim tunneling during a program mode. None of the biasing voltages exceed 12 Volts, thereby enabling the flash EEPROM cell to operate in a 3.3 Volt system. In one embodiment, an array of flash EEPROM cells are fabricated in the second well region.

19 Claims, 6 Drawing Sheets

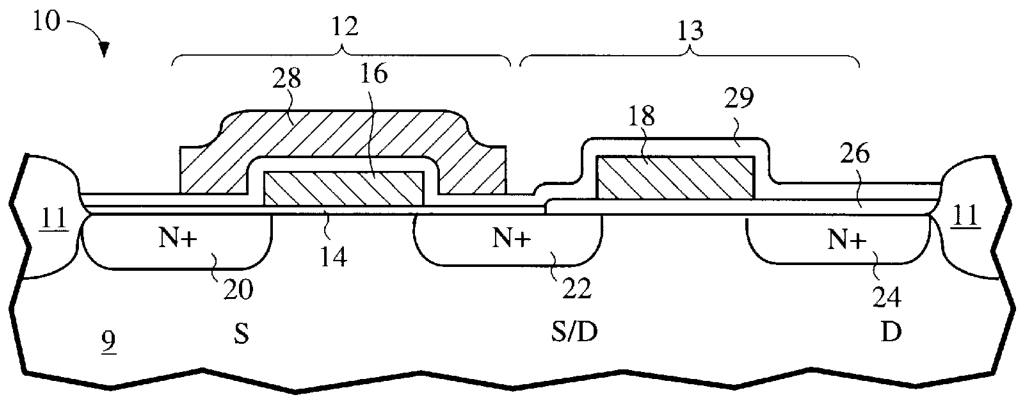
FIG. 1
PRIOR ART
200
| | VOLTAGE APPLIED | | | |
|---|---|---|---|---|
| OPERATION | SOURCE | SELECT GATE | CONTROL GATE | DRAIN |
| PROGRAM | FLOAT | 16-20 V | 0 | 16-20V |
| ERASE | 0 | 0 | 16-20 V | 0 |
| READ | 0 | $V_{CC}$ | 0 | 1 |
FIG. 2
PRIOR ART
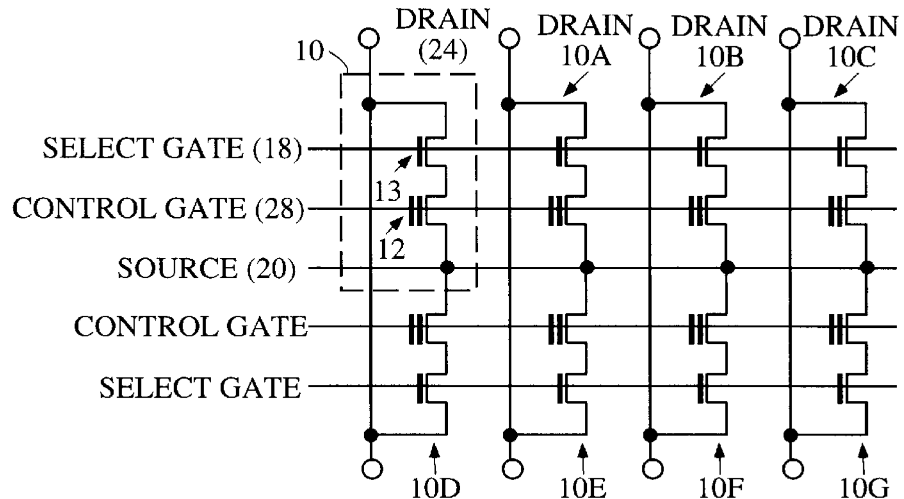
FIG. 3
PRIOR ART

| | Selected WL | | Non-Selected WL | | | | | |
|---|---|---|---|---|---|---|---|---|
| MODE | Vcg | Vag | Vcg | Vag | Vs | Vd | Vpwell | Vnwell |
| Program | -7 to -11 Volts | 8 Volts | 0 Volts | 0 Volts | High Z | 5 to 8 Volts | 0 Volts | 3.3 Volts |
| Program Inhibit | -7 to -11 Volts | 8 Volts | 0 Volts | 0 Volts | High Z | 0 Volts | 0 Volts | 3.3 Volts |
| Erase | 8 to 10 Volts | 0 Volts | -- | -- | -8 to -10 Volts | High Z | -8 to -10 Volts | 3.3 Volts |
| Read | 3.3 Volts | 3.3 Volts | 0 Volts | 0 Volts | 0 Volts | 1 Volt | 0 Volts | 3.3 Volts |

FIG. 8

TWO TRANSISTOR FLASH EEPROM CELL AND METHOD OF OPERATING SAME

BACKGROUND OF THE INVENTION

1. Field of the Invention

The present invention relates to a flash electrically erasable programmable read only memory (EEPROM) cell. More specifically, the present invention relates to a flash EEPROM cell for use in low-voltage, high-speed, high-density applications, such as in complex programmable logic devices (CPLDs).

2. Related Art

FIG. 1 is a cross sectional view of a conventional EEPROM cell 10, which includes p-type substrate 9, field isolation regions 11, floating gate transistor 12 and select gate transistor 13. EEPROM cell 10 is described in U.S. Pat. No. 5,471,422 by Chang et al. Floating gate transistor 12 includes n+ type source region 20, n+ source/drain region 22, tunnel dielectric 14, floating gate 16, interlayer dielectric layer 29, and control gate 28. Select gate transistor 13 includes n+ source/drain region 22, n+ drain region 24, gate dielectric layer 26, select gate 18 and interlayer dielectric layer 29.

In operation, EEPROM cell 10 is programmed, erased and read in accordance with the Table 200 illustrated in FIG. 2.

To program EEPROM cell 10, a programming voltage of 16 to 20 Volts is applied to drain region 24 and select gate 18, while control gate 28 is grounded (and source region 20 is left floating). Under these conditions, electrons tunnel from floating gate 16 through tunnel dielectric 14 to drain region 24, thereby leaving floating gate 16 positively charged.

To erase EEPROM cell 10, a programming voltage of 16 to 20 Volts is applied to control gate 28, while source region 20, select gate 18 and drain region 22 are connected to ground. Under these conditions, electrons tunnel from the channel region of floating gate transistor 12 through tunnel dielectric 14 to floating gate 16, thereby creating a negative charge on floating gate 16.

To read EEPROM cell 10, the $V_{cc}$ supply voltage of about 5 Volts is applied to select gate 18, a voltage of about 1 Volt is applied to drain region 24, and control gate 28 and source region 20 are connected to ground. A sense amplifier is used to detect the current between source region 20 and drain region 24. A high current indicates a programmed cell and a low current indicates an erased cell.

FIG. 3 is a circuit diagram of EEPROM cell 10 coupled to a plurality of identical EEPROM cells 10A–10G to form an array. The source regions of these EEPROM cells are commonly connected, thereby limiting this array to use in memory applications, and prohibiting the array from being used in a CPLD application. In CPLD applications, each column of cells needs to have separate source and drain bit lines, so that a feedback voltage may be applied to the source bit lines to limit the total read current in the event that a large number of cells are simultaneously turned on in the same column.

The programming voltage of 16 to 20 Volts required to program and erase EEPROM cell 10 is a relatively high voltage. As lower $V_{cc}$ supply voltages are implemented (e.g., 3.3 Volts or 2.5 Volts) it becomes difficult, if not impossible, to generate such high programming voltages.

In addition, as the $V_{cc}$ supply voltage is reduced from 5 Volts to 3.3 Volts, the minimum geometry of the fabricated devices is typically reduced from 0.6 &m to 0.35 &m and smaller. The isolation between individual devices is achieved by relatively thick regions of oxide. The thickness of this oxide is limited by the patterning capabilities of the optical photoresist technology to about 4000 Å for a 0.35 &m process. An isolation oxide of 4000 Å provides adequate isolation for voltages of up to approximately 12 Volts. Such an isolation oxide is therefore inadequate to isolate devices when using a programming voltage of 16 to 20 Volts. As a result, a programming voltage of 16 to 20 Volts cannot be used in devices which are fabricated using a 0.35 &m process.

It would therefore be desirable to have a flash EEPROM cell that operates in response to a $V_{cc}$ supply voltage of 3.3 Volts or lower, and can be programmed and erased with on-chip voltages that are limited to 12 Volts or less.

Another two-transistor memory cell is described in more detail in U.S. patent application Ser. No. 08/722,645 entitled “Two Transistor Flash EPROM Cell” by Anders T. Dejenfelt, Kameswara K. Rao and George H. Simmons, filed Sep. 27, 1996. However, the programming mechanism of this memory cell is hot-electron channeling, which requires relatively a high supply voltage (i.e., 5 Volts) and relatively high programming currents.

U.S. Pat. No. 5,432,740 by D'Arrigo et al. describes an EEPROM memory cell having a merged pass transistor. This memory cell is not well suited for use in a high speed CPLD for two reasons. First, during a read operation, selected word lines are biased at a voltage of +5 Volts, and non-selected word lines are biased at a voltage of −5 Volts. Switching a word line therefore involves a voltage swing of 10 Volts. A relatively long time period is required to complete a switching operation having such a large voltage swing. As a result, the switching time for the word lines of the memory cells of D'Arrigo are undesirably long, thereby rendering the memory cells impractical for use in a high speed CPLD.

In addition, within a CPLD, multiple rows of memory cells can be simultaneously enabled. In contrast, only a single row of memory cells is enabled at any given time within a conventional memory array. It is therefore possible for many more word lines to be simultaneously switched in a CPLD. If the memory cells of D'Arrigo were used in a CPLD, a relatively large number of associated word lines could be switched at any given time. However, it is impractical to build a charge pump having the capacity to supply the current required to simultaneously switch a large number of word lines between −5 Volts and +5 Volts.

Accordingly, it would also be desirable to have a flash EEPROM cell structure that can be coupled in an array to form a high-speed device, such as a CPLD.

SUMMARY

Accordingly, the present invention provides a flash EEPROM cell fabricated in a semiconductor substrate. A first well region having a first conductivity type (e.g., n-type) is located in the semiconductor substrate. A second well region having a second conductivity type (e.g., p-type) is located in the first well region. A non-volatile memory transistor and an access transistor are fabricated in the second well region. The non-volatile memory transistor and the access transistor are connected in series, by coupling the source of the access transistor to the drain of the non-volatile memory transistor. The non-volatile memory transistor has a floating gate located over a tunnel oxide, and a control gate located over the floating gate, with a dielectric layer located between the control gate and the floating gate. The access transistor has an access gate located over a gate oxide layer. The control gate and the access gate are independently controllable.

The first well region, the second well region, the non-volatile memory transistor and the access transistor are biased such that electrons are transferred from the first well region to the floating gate of the non-volatile memory transistor by Fowler-Nordheim tunneling during an erase mode. In a particular embodiment, this biasing includes applying a positive voltage to the control gate of the non-volatile memory transistor, and applying a negative voltage to the source of the non-volatile memory transistor and to the second well region. The first well region is biased such that the p-n junction between the first and second well regions is not forward biased.

The first well region, the second well region, the non-volatile memory transistor and the access transistor are biased such that electrons are transferred from the floating gate of the non-volatile memory transistor through the access transistor by Fowler-Nordheim tunneling during a program mode. In a particular embodiment, this biasing includes applying a positive voltage to the access gate of the access transistor and to the drain of the access transistor, and applying a negative voltage to the control gate of the non-volatile memory transistor. The first and second well regions are biased such that the p-n junction between the first and second well regions are not forward biased.

The above described method of operating enables the program and erase modes to be implemented using voltages having magnitudes of less than 12 Volts. As a result, a flash EEPROM cell in accordance with the present invention is compatible with a 0.35 &m process and a specified $V_{cc}$ supply voltage of 3.3 Volts or less. Because both the program and erase modes use low-current Fowler-Nordheim mechanisms, the voltage generation circuits required to bias the various elements are easily fabricated on the same chip as the flash EEPROM cell.

In another embodiment of the present invention, a plurality of flash EEPROM cells are fabricated in the second well region and are coupled in a plurality of rows and columns to form an array. Each column includes a set of the flash EEPROM cells, a first bit line connected to the source of each non-volatile memory transistor in the set of flash EEPROM cells, and a second bit line connected to the drain of each access transistor in the set of flash EEPROM cells. Each column also includes a sense amplifier circuit connected to the first and second bit lines.

Each row includes a set of the flash EEPROM cells, wherein the control gates of each of the non-volatile memory transistors in the set of flash EEPROM cells are coupled in series, and wherein the access gates of each of the access transistors in the set of flash EEPROM cells are coupled in series.

The flash EEPROM cells in the array are erased in a blanket mode. The flash EEPROM cells in the array are programmed on a per row basis. Thus, a selected row is programmed while non-selected rows are not programmed. The access transistors in the non-selected rows are turned off during the program mode, thereby advantageously minimizing the probability of disturbing the state of the flash EEPROM cells in the non-selected rows during the program mode.

During a read mode, a read voltage equal to the $V_{cc}$ supply voltage (e.g., 3.3 Volts) is applied to the control gates and access gates of the flash EEPROM cells in the selected rows. A voltage of 0 Volts is applied to the control gates and the access gates of the flash EEPROM cells in the non-selected rows. The voltage swing between selected and non-selected rows is therefore maintained at a relatively low voltage. As a result, flash EEPROM cells in accordance with the present invention can be used in a high speed devices, such as CPLDs.

The present invention will be more fully understood in view of the following description and drawings.

BRIEF DESCRIPTION OF THE DRAWINGS

FIG. 1 is a cross sectional view of a conventional EEPROM cell;

FIG. 2 is a table defining the read, program and erase modes of the EEPROM cell of FIG. 1;

FIG. 3 is a circuit diagram of a conventional array of EEPROM cells;

FIG. 8 is a table that summarizes the read, erase, program and program inhibit modes of the array of flash EEPROM cells of FIG. 6 in accordance with one embodiment of the invention.

DETAILED DESCRIPTION

Figure 4:
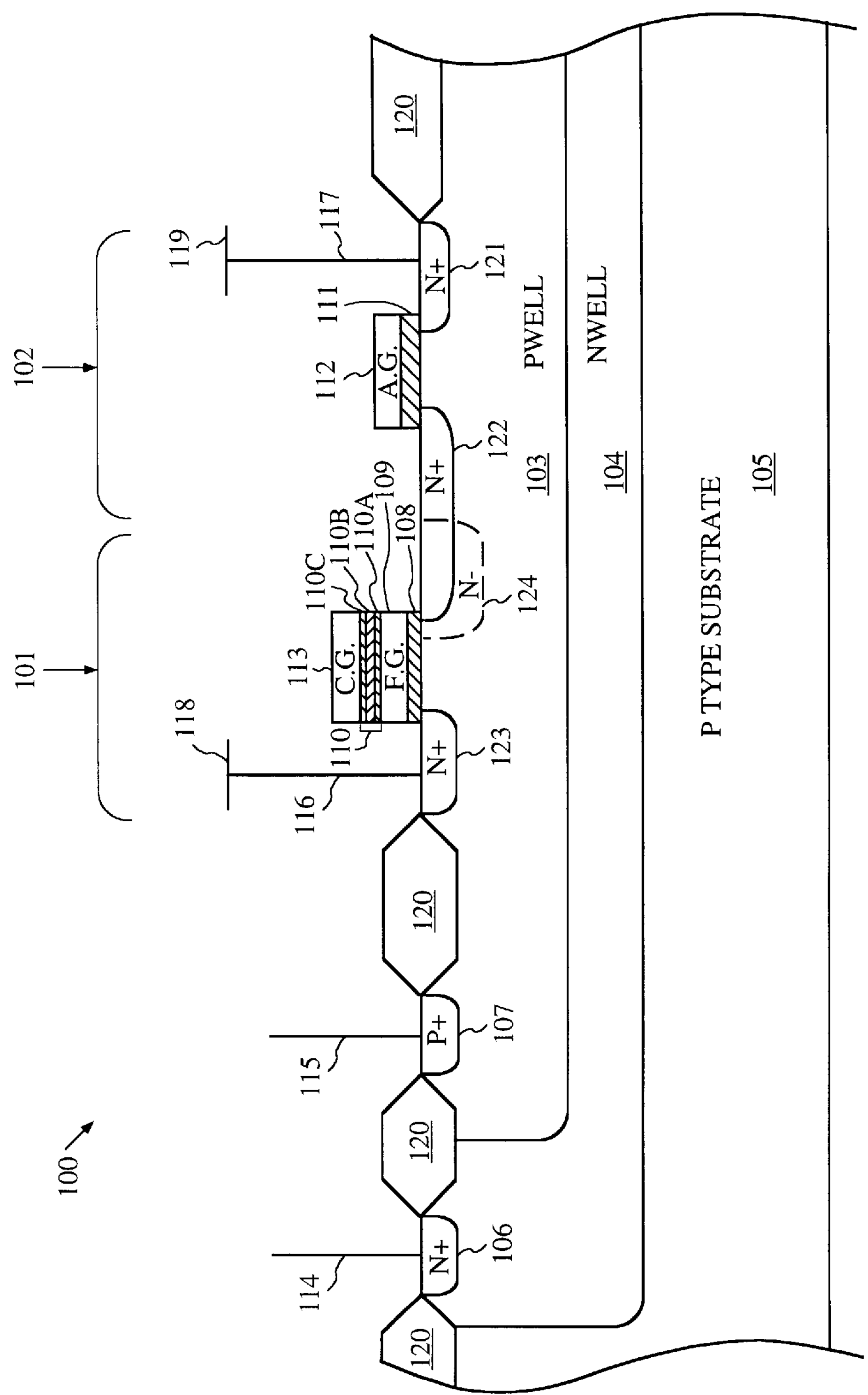
FIG. 4 is a cross sectional view of a flash EEPROM cell in accordance with one embodiment of the invention.

FIG. 4 is a cross sectional view of a flash EEPROM cell 100 in accordance with one embodiment of the invention. Flash EEPROM cell 100 includes non-volatile memory transistor 101 and access transistor 102, which are fabricated on a monocrystalline semiconductor substrate 105. In the described example, substrate 105 is a p-type monocrystalline silicon having a boron dopant concentration of $10^{14}$ to $10^{15}$ $cm^{-3}$, although other types of semiconductor materials and other dopant concentrations can be used in other embodiments. An n-type well region (n-well) 104 is formed within substrate 105 as illustrated. In the described embodiment, n-well 104 has a dopant concentration of about $10^{15}$ to $10^{16}$ $cm^{-3}$. A p-type well region (p-well) 103 is formed within n-well 104. P-well 104 has a dopant concentration of about $10^{16}$ to $10^{17}$ $cm^{-3}$. N-well 104 and p-well 103 are formed using conventional semiconductor processing techniques, such as ion implantation or diffusion. Field oxide layer 120 is formed over the upper surface of substrate 105 using conventional semiconductor processing techniques. In the described embodiment, field oxide layer 120 is silicon oxide having a thickness of approximately 4500 Å.

Non-volatile memory transistor 101 and access transistor 102 are both fabricated within p-well 103. Non-volatile memory transistor 101 is a stack-type double-poly transistor which includes a thin tunnel oxide film 108, a floating gate 109, an inter-poly dielectric layer 110 and a control gate 113. In the described embodiment, tunnel oxide film 108 is silicon oxide (i.e., $SiO_2$) which is grown over the upper surface of p- well 103 to a thickness of approximately 80 to 100 Å. As described in more detail below, tunnel oxide film 108 facilitates Fowler-Nordheim (F-N) programming and erasing of non-volatile memory transistor 101.

Floating gate 109 is a lightly doped polycrystalline silicon layer which is deposited over tunnel oxide film 108 to a thickness of approximately 1000 to 3000 Å. In one embodiment, the polycrystalline silicon layer is lightly doped with phosphorous. As described in more detail below, floating gate 109 stores charge to determine the logic state (i.e., programmed or erased) of non-volatile memory transistor 101.

Inter-poly dielectric layer 110 is deposited over floating gate 109. In the described embodiment, inter-poly dielectric layer 110 is a multi-layer structure which includes three dielectric layers 111A, 110B and 110C. Dielectric layer 110A is a layer of silicon oxide (e.g., $SiO_2$) which is deposited over floating gate 109 to a thickness of approximately 100 Å. Dielectric layer 110B is a layer of silicon nitride (e.g., $SiN_4$) which is deposited over dielectric layer 110A to a thickness of approximately 100 Å. Dielectric layer 110C is a layer of silicon oxide (e.g., $SiO_2$) which is deposited over dielectric layer 110B to a thickness of approximately 40 Å. The combined dielectric layers 110A, 110B and 110C are commonly referred to as an ONO (oxide-nitride-oxide) layer. Dielectric layers 110A, 110B and 110C can have other thicknesses in other embodiments. Moreover, inter-poly dielectric layer 110 can be made of other dielectric compositions, such as a single layer of silicon oxide, in other embodiments.

After inter-poly dielectric layer 110, floating gate 109 and tunnel oxide have been formed, the upper surface of p-well 103 is exposed in the area where access transistor 102 is to be formed. This area is exposed using conventional etching processes. Gate oxide 111 is then formed at the upper surface of p-well 103 to a thickness of about 120 to 200 Å. In the described embodiment, gate oxide 111 is silicon oxide ($SiO_2$). Gate oxide 111 is fabricated in accordance with conventional semiconductor processing techniques.

An electrically conductive layer is then formed over the resulting structure. This conductive layer can be, for example, a layer of conductively doped polycrystalline silicon or a layer of polycide. Polycide includes a layer of metal (e.g., tungsten) or a layer of metal silicide (e.g., tungsten silicide) deposited over a layer of conductively doped polycrystalline silicon. This conductive layer is patterned and etched to form control gate 113 of non-volatile memory transistor 101, and access gate 112 of access transistor 102.

P+ type region 107 is formed in p-well 103 using conventional semiconductor processing methods, thereby forming a p-well contact region. P-well contact region 107 has a dopant concentration of $10^{19}$ to $10^{20}$ $cm^{-3}$ in the described example.

N− type region 124, which is formed at the drain side of the non-volatile memory transistor 101, is formed by a one-sided phosphorus implant with a total dose of 5E13 to 5E14 at an energy in the range of 50–120 keV. An annealing step is performed to diffuse the phosphorous for 30–90 minutes at 900° to 950° C.

N+ type region 106 is formed in n-well 104 using conventional semiconductor processing methods, thereby forming an n-well contact region. N+ type drain region 121, n+ type source/drain region 122 and n+ type source region 123 are formed in p-well as illustrated using conventional semiconductor processing methods. In one embodiment, these n+ regions 106 and 121–123 are simultaneously formed by an ion implantation that is self-aligned with control gate 113, access gate 112 and field oxide layer 120. N+ drain region 121 and n+ source/drain region 122 form the drain and source regions, respectively, of access transistor 102. N+ source/drain region 122 and source region 123 form the drain and source regions, respectively, of non-volatile memory transistor 101. N+ drain region 121, n+ source/drain region 122 and source region 123 have dopant concentrations of about $10^{19}$ to $10^{20}$ $cm^{-3}$ in the described example. It is understood that these n+ type regions 121–123 can have other dopant concentrations in other embodiments. The n− type region 124 and the n+ source/drain region 122 form a smoothly graded junction at the drain of non-volatile memory transistor 101, thereby minimizing band-to-band tunneling current during a programming operation.

An insulating layer (not shown), which is doped with phosphorous and/or boron, is deposited over the resulting structure to act as a contamination diffusion barrier and as an insulating layer. Vias (not shown) are patterned and etched in this doped insulating layer, thereby exposing regions 106, 107, 121 and 123. An electrically conductive layer (not shown), typically aluminum or an aluminum alloy, is then deposited over the doped insulating layer and into the vias. The metal layer is then patterned and etched, thereby forming contacts 114–117 and bit line traces 118–119. Contacts 114, 115, 116 and 117 contact n-well contact region 106, p-well contact region 107, source region 123 and drain region 121, respectively. Electrically conductive connections are provided for p-type substrate 105, control gate 113 and access gate 112 in an area which is not illustrated in FIG. 4.

Figure 5:
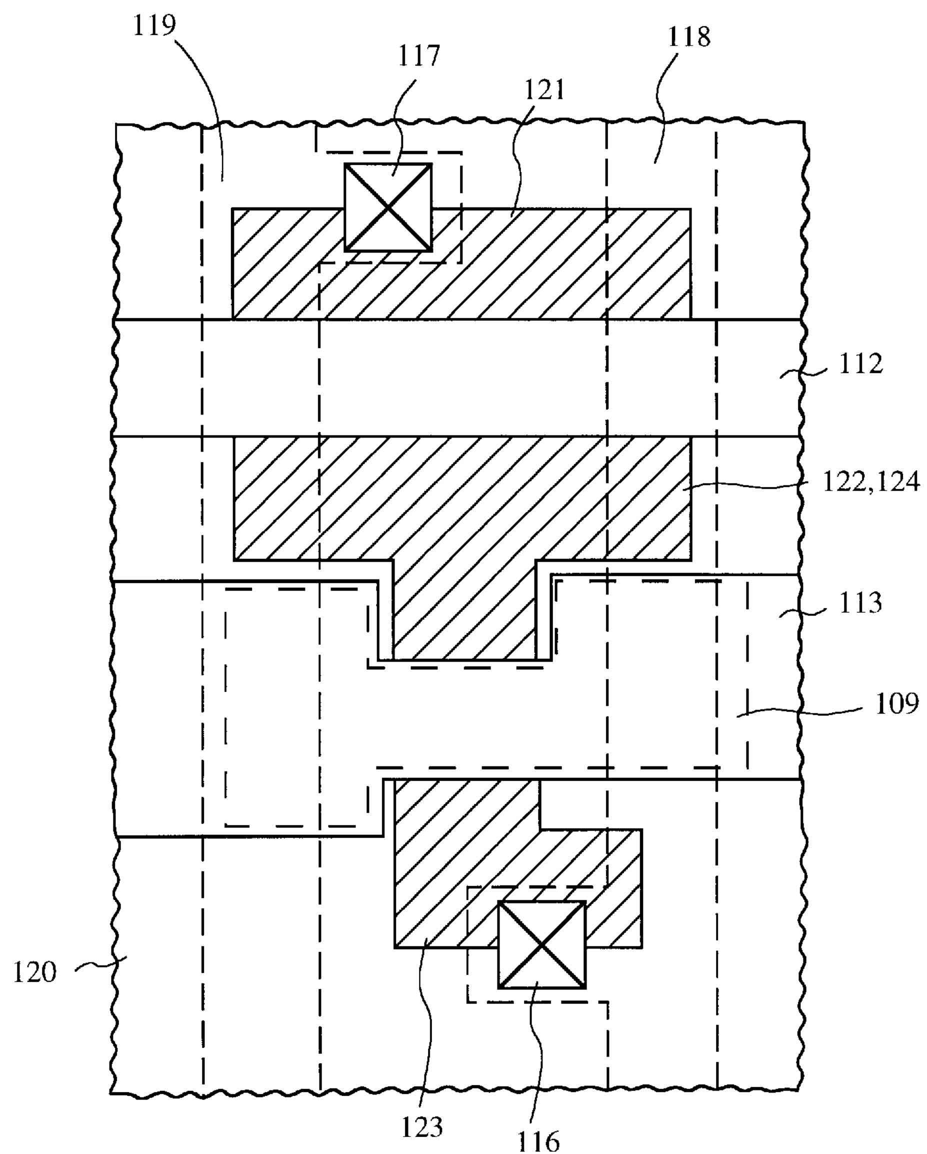
FIG. 5 is a top layout view of the flash EEPROM cell of FIG. 4 in accordance with one embodiment of the present invention.

FIG. 5 is a top layout view of flash EEPROM cell 100 in accordance with one embodiment of the present invention (not including the n-well contact region 106 or the p-well contact region 107). Drain region 121, source/drain region 122 and source region 123 are shaded in FIG. 5. Access gate 112 extends horizontally across the width of cell 100. Control gate 113 also extends horizontally across the width of cell 100. Floating gate 109 is shown in long dashed lines. The area of overlap between control gate 113 and 109 is maximized by extending these elements over field oxide layer 120. Note that in FIG. 5, field oxide layer 120 is present in all regions except for those regions defined by drain region 121, source/drain region 122, source region 123, and the channel regions of transistors 101 and 102. Contacts 116 and 117 are shown as boxes containing X's. Finally, bit lines 118 and 119 are shown as short dashed lines which extend vertically across the height of cell 100. Flash EEPROM cell 100 has a compact layout which consumes about 15 square &m. As described in more detail below, the layout of flash EEPROM cell 100 facilitates the connection of this cell 100 with other identical flash EEPROM cells.

Floating gate 109 is capacitively coupled to control gate 113, drain region 121, source region 122 and p-well 103. The voltage on floating gate 109 ($V_{fg}$) is determined by the following equation.

$$V_{fg}=V_{cg}xK_{cg}+V_dxK_d+V_sxK_s+V_{pwell}xK_{pwell}-(Q_{fg}/C_{tot})$$

where $V_{cg}$, $V_d$, $V_s$, and $V_{pwell}$ are the voltages applied to control gate 113, drain region 121, source region 123 and p-well 103, respectively. $K_{cg}$, $K_d$, $K_s$ and $K_{pwell}$ are the coupling factors for control gate 113, drain region 121, source region 123, and p-well 103, respectively, to floating gate 109. $Q_{fg}$ is the charge stored in floating gate 109, and $C_{tot}$ is the total capacitance of floating gate 109 to the four nodes (i.e., control gate 113, drain region 121, source region 123 and p-well 103).

The values of the coupling factors $K_{cg}$, $K_d$, $K_s$ and $K_{pwell}$ depend on the relative strength of the capacitances between control gate 113, drain region 121, source region 123 and pwell 103, respectively, and floating gate 109. It is desirable to have a high coupling factor $K_{cg}$ (i.e., strong coupling) between floating gate 109 and control gate 113 for all modes of operating flash EEPROM cell 100. A high coupling factor $K_{cg}$ is achieved by providing a large area of overlap between floating gate 109 and control gate 113 where these gates extend over the field isolation oxide layer 120. (See, FIG. 5.) In the present invention, it is desirable for the coupling factor $K_{cg}$ to have a value in the range of 0.75 to 0.90.

The operation of flash EEPROM cell 100 in accordance with one embodiment of the invention is described below. In general, flash EEPROM cell 100 is maintained in one of five modes: read, erase, program, program inhibit and standby.

The standby mode is defined as a mode in which external voltages are not applied to flash EEPROM cell 100. While in the standby mode, floating gate 109 is electrically isolated from substrate 105 by tunnel oxide film 108. Floating gate 109 is further isolated from control gate 113 by inter-poly dielectric layer 110. As a result, floating gate 109 retains any charge which was previously stored in floating gate 109 (during a prior program or erase operation). As long as flash EEPROM cell 100 remains in the standby mode, floating gate 109 will retain the stored charge for a relatively long time period (e.g., ten years or more).

The read mode of flash EEPROM cell 100 is entered by applying a $V_{cc}$ supply voltage, which has a specified voltage of 3.3 Volts, to both access gate 112 and control gate 113. The voltage applied to access gate 112 is hereinafter designated as $V_{ag}$. Thus, in the read mode, $V_{ag}$ and $V_{cg}$ are both equal to the $V_{cc}$ supply voltage of 3.3 Volts. Source region 123 and drain region 121 are connected to a conventional sense amplifier circuit (not shown). A voltage $V_d$ of approximately 1 volt is applied to drain region 121. Source region 123 is coupled to a virtual ground voltage of approximately 0 volts. Thus, $V_s$ is equal to 0 volts. P-well 103 is connected to the $V_{ss}$ (ground) supply voltage of 0 volts, and n-well 104 is connected to receive the $V_{cc}$ supply voltage of 3.3 volts.

As described in more detail below, floating gate 109 will either store a neutral to positive charge (if flash EEPROM cell 100 has been programmed) or a negative charge (if flash EEPROM cell 100 has been erased). When floating gate 109 stores a neutral to positive charge, non-volatile memory transistor 101 will exhibit a relatively low threshold voltage. As a result, the 3.3 Volt signal applied to control gate 113 is sufficient to cause non-volatile memory transistor 101 to enter a conductive state (i.e., turn on). Similarly, the 3.3 Volt signal applied to access gate 112 is sufficient to cause access transistor 102 to enter a conductive state (i.e., turn on). Because both non-volatile memory transistor 101 and access transistor 102 are turned on, a read current is conducted between drain region 121 and source region 123. This read current is detected by the sense amplifier, and is used to indicate a first logic state of flash EEPROM memory cell 100. Exemplary sense amplifiers which can be used in connection with the present invention are described in more detail in U.S. Pat. Nos. 5,530,384 and 5,631,583, which are hereby incorporated by reference.

When floating gate 109 stores a negative charge, non-volatile memory transistor 101 will exhibit a relatively high threshold voltage. As a result, the 3.3 Volt signal applied to control gate 113 is insufficient to cause non-volatile memory transistor 101 to enter a conductive state.

Because non-volatile memory transistor 101 is in a non-conductive state, no read current is conducted between drain region 121 and source region 123. This absence of read current is detected by the sense amplifier, and is used to indicate a second logic state of flash EEPROM memory cell 100.

The erase mode of flash EEPROM cell 100 is entered by applying a positive voltage ($V_{cg}$) in the range of about 8 to 10 Volts to control gate 113, and simultaneously applying a negative voltage of about −8 to −10 Volts to source region 123 and to p- well 103. N-well 106 is maintained at the $V_{cc}$ supply voltage of about 3.3 volts during the erase operation, thereby preventing the p-n junction between n-well 103 and p-well 104 from being forward biased. Drain region 121 is maintained in a high impedance state (i.e., floating).

The erase mode conditions establish a relatively high voltage between floating gate 109 and source region 123. The erase mode conditions also establish a relatively high voltage between floating gate 109 and p-well 103. These high voltages result in an electric field having a magnitude and polarity sufficient to cause electrons to engage in F-N tunneling from p-well 103 and source region 123 into floating gate 109. By biasing the p-well 103, the maximum applied voltage is effectively reduced by half, thereby reducing the breakdown requirements of the high voltage transistors in the process. This significantly simplifies the integration of the high voltage transistors onto the low voltage CMOS process.

The tunneling of electrons into floating gate 109 establishes a negative charge on floating gate 109. This negative charge increases the threshold voltage of non-volatile memory transistor 101. It is noted that the voltage applied to source region 123 is less than 12 Volts. As a result, the field oxide layer 120 provides adequate isolation during the erase mode.

The program mode of flash EEPROM cell 100 is entered by applying a voltage ($V_{cg}$) of −7 to −10 Volts to control gate 113, applying a voltage ($V_{ag}$) of about 8 Volts to access gate 112, and applying a voltage ($V_d$) of about 5 to 8 Volts to drain region 121. Source region 123 is maintained in a high impedance state (i.e., floating) during the program mode. P-well 103 is grounded, and the $V_{cc}$ supply voltage of about 3.3 volts is applied to n-well 104, thereby ensuring that the p-n junction formed by p-well 103 and n-well 104 is not forward biased.

In the program mode, access transistor 102 turns on in response to the 8 Volt signal ($V_{ag}$) applied to access gate 112. The 5 to 8 Volt signal ($V_d$) applied to drain region 121 is transmitted to source/drain region 122 through the turned on access transistor 102. As a result, an electric field is established having a magnitude and polarity sufficient to cause the F-N tunneling of electrons from floating gate 109 to source/drain region 122. The tunneling of electrons from floating gate 109 to source/drain region 122 results in a neutral to positive charge being stored in floating gate 109. This neutral to positive charge reduces the threshold voltage of non-volatile memory transistor 101 while the flash EEPROM cell 100 is programmed. It is noted that the voltage applied to drain region 121 is less than 12 volts. As a result, the field oxide layer 120 provides adequate isolation during the program mode.

As previously described, both the program and erase modes use F-N tunneling mechanisms to change the charge stored by floating gate 109. These F-N tunneling mechanisms require much lower current than hot electron injection. As a result of these lower current requirements, the high voltages required for program and erase modes are able to be generated on the same chip as flash EEPROM cell 100. Moreover, these F-N tunneling mechanisms use voltages of less than 12 Volts, thereby ensuring that the field oxide layer 120 is capable of providing adequate isolation between the various elements fabricated on the same chip as flash EEPROM cell 100.

Figure 6:
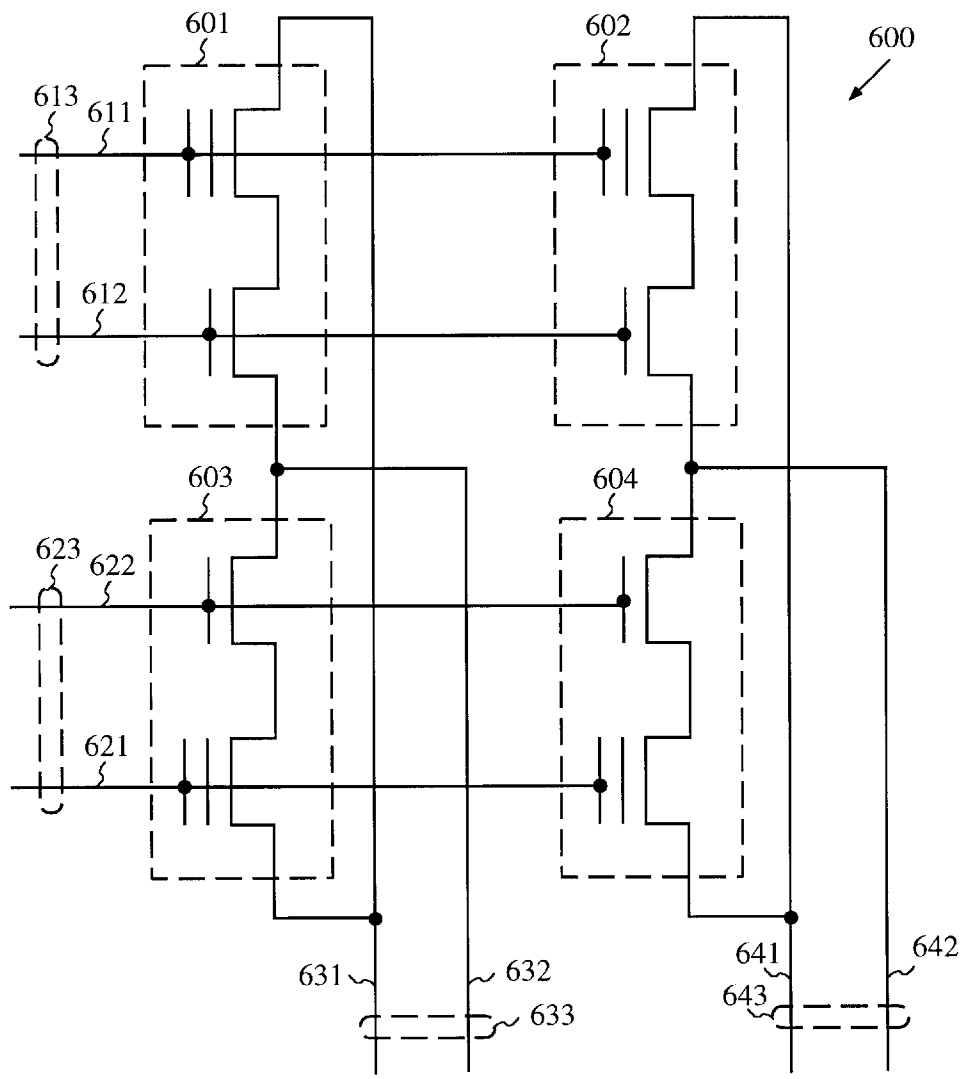
FIG. 6 is a circuit diagram of an array of flash EEPROM cells in accordance with one embodiment of the invention.
Figure 7:
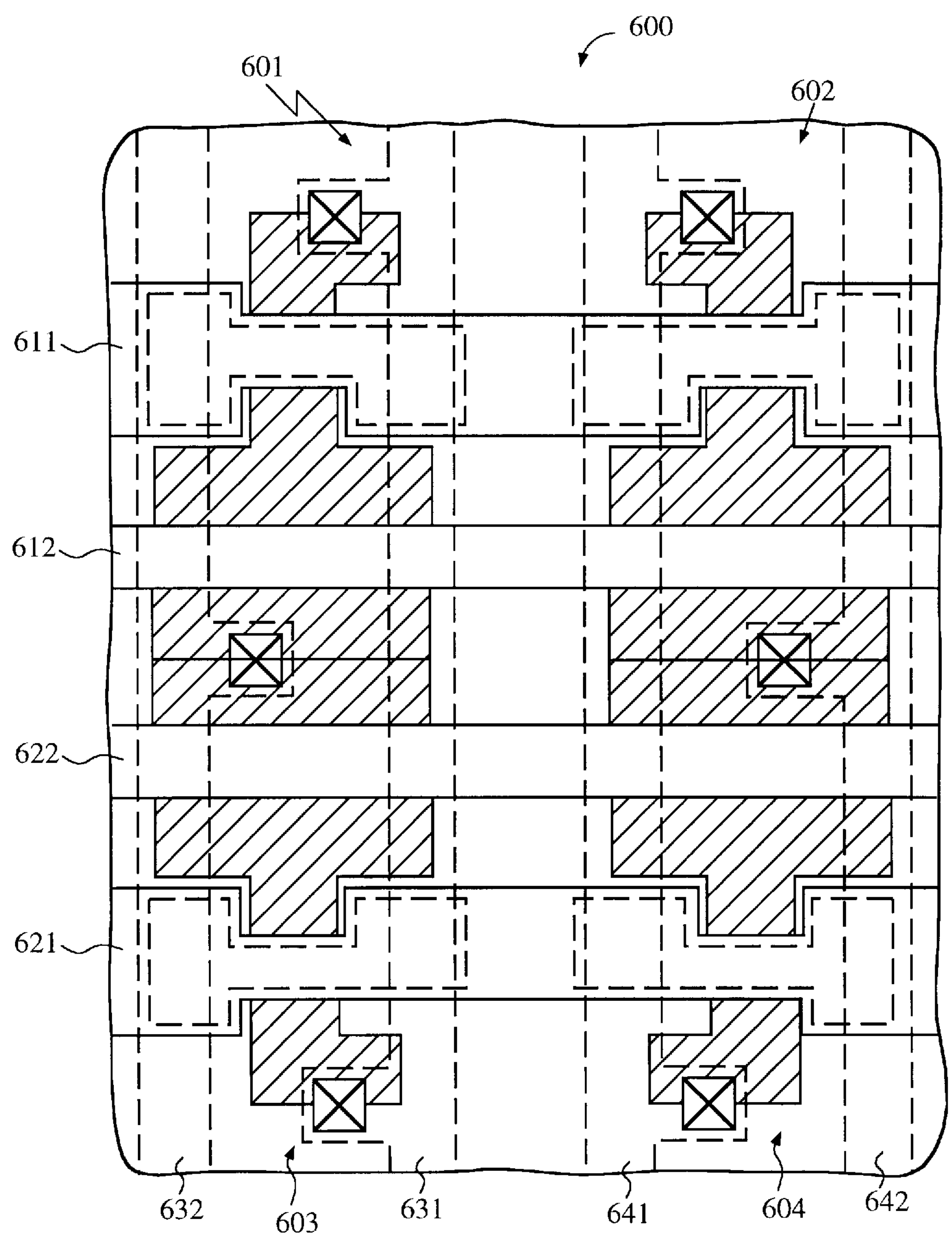
FIG. 7 is a top layout view of the array of flash EEPROM cells of FIG. 6 in accordance with one embodiment of the invention.

FIG. 6 is a circuit diagram of an array 600 of flash EEPROM cells 601, 602, 603 and 604. FIG. 7 is a top layout view of the flash EEPROM cells 601–604 of array 600. Each of flash EEPROM cells 601–604 is similar to previously described flash EEPROM cell 100. More specifically, cell 603 is identical to cell 100; cell 604 is the horizontal mirror image of cell 100; cell 601 is the vertical mirror image of cell 100, and cell 602 is the horizontal+vertical mirror image of cell 100. The control gate of cell 601 (corresponding to control gate 113 of cell 100) is commonly connected to the control gate of cell 602 along the horizontal direction, thereby forming a first control gate word line 611. The access gate of cell 601 (which corresponds to access gate 112 of cell 100) is commonly connected to the access gate of cell 602 along the horizontal direction, thereby forming a first access gate word line 612. The layout of flash EEPROM memory cells 601–602 facilitates the formation of the continuous first control gate word line 611 and the continuous first access gate word line 612. The first control gate word line 611 and first access gate word line 612 form a first word line pair 613.

Similarly, the control gate of cell 603 is commonly connected to the control gate of cell 604 along the horizontal direction, thereby forming a second control gate word line 621. The access gate of cell 603 is commonly connected to the access gate of cell 604 along the horizontal direction, thereby forming a second access gate word line 622. The second control gate word line 621 and the second access gate word line 622 form a second word line pair 623.

The source regions of flash EEPROM cells 601 and 603 (which correspond to source region 123 of cell 100) are commonly connected along the vertical direction, thereby forming a first source bit line 631. The drain regions of flash EEPROM cells 601 and 603 (which correspond to drain region 121 of cell 100) are commonly connected along the vertical direction, thereby forming a first drain bit line 632. First source bit line 631 and first drain bit line 632 form a first bit line pair 633.

Similarly, the source regions of flash EEPROM cells 602 and 604 are commonly connected along the vertical direction, thereby forming a second source bit line 641. The drain regions of flash EEPROM cells 602 and 604 are commonly connected along the vertical direction, thereby forming a second drain bit line 642. Second source bit line 641 and second drain bit line 642 form a second bit line pair 643.

Although array 600 is illustrated as a 2×2 array, it is understood that arrays having other dimensions are contemplated and considered to be within the scope of the present invention.

FIG. 8 is a table that summarizes the read, erase, program and program inhibit modes of array 600. The read, erase and program modes of array 600 will now be described.

In the read mode, one or more rows of cells can be selected to perform a read operation. This type of read operation is typically used in CPLDs to implement OR or NAND logical functions. The word line pair corresponding to each selected row of cells is coupled to receive the $V_{cc}$ supply voltage. For example, if the first row of cells (i.e., cells 601 and 602) is selected to be read, then first word line pair 613 is coupled to receive the $V_{cc}$ supply voltage. More specifically, the $V_{cc}$ supply voltage is applied to first control gate word line 611 and first access gate word line 612. Because the second row of cells (i.e., cells 603 and 604) is not selected to be read, the second word line pair 623 is coupled to receive the $V_{ss}$ ground supply voltage. More specifically, second control gate word line 621 and second access gate word line 622 are each coupled to receive the $V_{ss}$ ground supply voltage.

The first source bit line 631 and the first drain bit line 632 are coupled to a corresponding sense amplifier, such as one of the sense amplifiers described in U.S. Pat. Nos. 5,530,384 and 5,631,583. This sense amplifier provides a virtual ground supply voltage to the first source bit line 631 and provides a feedback voltage of about 1 volt to the first drain bit line 632. The second source bit line 641 and the second drain bit line 632 are coupled to a corresponding sense amplifier in the same manner. P-well 103 is coupled to receive the $V_{ss}$ ground supply voltage, and n-well 104 is coupled to receive the $V_{cc}$ supply voltage of 3.3 volts. As a result, cells 601 and 602 are placed in read mode, and cells 603 and 604 are placed in standby mode. The logic states of cells 601 and 602 are detected by the associated sense amplifier circuits.

It is important to note that the selected word line pairs are biased with the $V_{cc}$ supply voltage of 3.3 Volts, and that the non-selected word line pairs are biased with the ground supply voltage of 0 Volts. As a result, the voltage swing between selected and non-selected word line pairs is relatively small. This small voltage swing enables the $V_{cc}$ voltage supply to supply the currents necessary to simultaneously switch a large number of word line pairs. Advantageously, no charge pump is required.

If both the first and second rows of cells are selected to be read, then both the first word line pair 613 and the second word line pair 623 are coupled to receive the $V_{cc}$ supply voltage. The first and second source bit lines 631 and 641 are coupled to receive the virtual ground supply voltage, and the first and second drain bit lines 632 and 642 are coupled to receive a feedback voltage of approximately 1 Volt. P-well 103 is coupled to receive the Vss ground supply voltage, and n-well 104 is coupled to receive the $V_{cc}$ supply voltage of 3.3 volts. As a result, cells 601–604 are all placed in the read mode. If any one of the cells 601, 603 in the first column is programmed, the associated sense amplifier circuit will detect a first logic state. If none of the cells 601–603 in the first column is programmed, the associated sense amplifier circuit will detect a second logic state. In this manner, the first column of cells implements a logic OR function. The second column of cells operates in the same manner as the first column of cells.

If a large number of cells in a particular column are in the programmed state (i.e., conductive), the effective resistance presented by these cells is relatively low. This low resistance tends to increase the read current, which in turn, tends to reduce the voltage provided to the associated drain bit line. However, the sense amplifier includes a feedback path which boosts the voltage on the source bit line and limits the read current. By maintaining the voltage on the drain bit line at a predetermined level, the sense amplifier is prepared for the next read operation.

Flash EEPROM cells 601–604 of array 600 are erased in a blanket mode. That is, all of the cells 601–604 in array 600 are erased simultaneously. To accomplish this, a voltage of 8 to 10 volts is applied to the first and second control gate word lines 611 and 621, and a negative voltage of −8 to −10 Volts is applied to the first and second source bit lines 631 and 641. Simultaneously, a negative voltage of −8 to −10 Volts is applied to p-well 103, and the $V_{cc}$ supply voltage of 3.3 Volts is applied to n-well 104. As a result, cells 601–604 are placed in the previously described erase mode.

The programming of cells 601–604 in array 600 is implemented on a per word line basis. That is, one word line pair is selected for programming, and all or a fraction of the cells along this word line pair are programmed simultaneously. For example, cells 601 and 602 are programmed as follows. A voltage ($V_{cg}$) of −7 to −11 Volts is applied to first control gate word line 611 and a voltage ($V_{ag}$) of 8 Volts is applied to first access gate word line 612, thereby selecting the first word line pair 613. The first and second source bit lines 631 and 641 are each maintained at a high impedance state, and a voltage ($V_d$) of 5 to 8 Volts is applied to the first and second drain bit lines 632 and 642. P-well 103 is maintained at a voltage of 0 Volts and n-well 104 is maintained the $V_{cc}$ supply voltage of 3.3 Volts. As a result, cells 601 and 602 are placed in the program mode.

Both the second control gate word line 622 and the second access gate word line 612 are coupled to the $V_{ss}$ ground voltage supply, thereby preventing cells 603 and 604 from entering the program mode. Advantageously, the Vss ground supply voltage causes the access transistors in cells 603 and 604 to be turned off, thereby isolating the non-volatile memory transistors in cells 603 and 604 from the applied $V_d$ voltage of 5 to 8 Volts. As a result, the possibility of cells 603 and 604 being disturbed when cells 601 and 602 are in the program mode is prevented.

In order to inhibit programming of selected cells in the selected word line during the program mode, a voltage ($V_d$) of 0 Volts is applied to the drain bit lines associated with these selected cells. In the previous example, the programming of cell 601 could be inhibited by applying a voltage ($V_d$) of 0 Volts to first drain bit line 632. This applied voltage $V_d$ of 0 Volts is transmitted through the access transistor of cell 601, since this access transistor is turned on by the applied voltage $V_{ag}$ of 8 Volts. As a result, the voltage applied to the channel region of the non-volatile memory transistor of cell 601 is reduced, thereby reducing the electrical field in the tunnel oxide of this non-volatile memory transistor. The reduction of the electric field is of such a magnitude that the tunneling current in cell 601 is reduced by at least two orders of magnitude compared to selected cell 602. As a result, the non-selected cell 601 will not be programmed during the time allowed for the programming operation.

Although the invention has been described in connection with several embodiments, it is understood that this invention is not limited to the embodiments disclosed, but is capable of various modifications which would be apparent to a person skilled in the art. Thus, the invention is limited only by the following claims.

What is claimed is:

1. A flash electrically erasable programmable read only memory (EEPROM) cell comprising:

a semiconductor substrate;

a first well region having a first conductivity type located in the semiconductor substrate;

a second well region having a second conductivity type, opposite the first conductivity type, located in the first well region;

a non-volatile memory transistor located in the second well region; and an access transistor located in the second well region, the access transistor being coupled to the non-volatile memory transistor, the access transistor and the non-volatile memory transistor being independently controllable.

2. The flash EEPROM cell of claim 1, further comprising circuitry for biasing the first well region, the second well region, the non-volatile memory transistor and the access transistor.

3. The flash EEPROM cell of claim 1, further comprising a $V_{cc}$ voltage supply coupled to the flash EEPROM cell, wherein the $V_{cc}$ voltage supply generates a $V_{cc}$ supply voltage having a specified voltage of 3.3 Volts or less.

4. The flash EEPROM cell of claim 1, further comprising a continuous source/drain region having the first conductivity type located in the second well region, wherein the continuous source/drain region forms a drain region of the non-volatile memory transistor and a source region of the access transistor.

5. The flash EEPROM cell of claim 4, wherein the non-volatile memory cell further comprises a floating gate and a control gate, and the access transistor further comprises an access gate, the control gate and the access gate being separate structures which extend in parallel along a first direction over the substrate.

6. The flash EEPROM cell of claim 5, wherein the non-volatile memory cell further comprises a source region having the first conductivity type located in the second well region, and the access transistor further comprises a drain region having the first conductivity type located in the second well region.

7. The flash EEPROM cell of claim 6, further comprising:

a first bit line coupled to the source region of the non-volatile memory transistor; and a second bit line coupled to the drain region of the access transistor, wherein the first and second bit lines extend in parallel along second direction, perpendicular to the first direction, over the substrate.

8. A circuit comprising:

a semiconductor substrate;

a first well region having a first conductivity type located in the semiconductor substrate;

a second well region having a second conductivity type, opposite the first conductivity type, located in the first well region; and a plurality of flash electrically erasable programmable read only memory (EEPROM) cells located in the second located in the second well region, wherein each of the flash EEPROM cells includes a non-volatile memory transistor and an independently controllable access transistor coupled to the non-volatile memory transistor.

9. The circuit of claim 8, wherein the flash EEPROM cells are arranged in a plurality of rows and columns.

10. The circuit of claim 9, wherein each column of flash EEPROM cells comprises:

a set of the flash EEPROM cells;

a first bit line connected to a source of each of the non-volatile memory transistors in the set of flash EEPROM cells; and a second bit line connected to a drain of each of the access transistors in the set of flash EEPROM cells.

11. The circuit of claim 10, wherein each column of flash EEPROM cells further comprises a sense amplifier circuit connected to the first and second bit lines.

12. The circuit of claim 9, each of the non-volatile memory transistors having a floating gate and a control gate, and each of the access transistors having an access gate, wherein each row of the flash EEPROM cells comprises a set of the flash EEPROM cells, the control gates of each of the non-volatile memory transistors in the set of flash EEPROM cells being coupled in series, and the access gates of each of the access transistors in the set of flash EEPROM cells being coupled in series.

13. A method of operating a flash electrically erasable programmable read only memory (EEPROM) cell which includes a non-volatile memory transistor coupled in series with an access transistor, the non-volatile memory transistor and the access transistor being located in a first well region, which in turn, is located in a second well region, the method comprising the steps of:

independently controlling the non-volatile memory transistor and the access transistor;

causing electrons to be transferred from the first well region to a floating gate of the non-volatile memory transistor by Fowler-Nordheim tunneling; and causing electrons to be transferred from the floating gate of the non-volatile memory transistor through the access transistor by Fowler-Nordheim tunneling.

14. The method of claim 13, wherein the step of causing electrons to be transferred from the first well region to the floating gate comprises the steps of:

applying a voltage having a first polarity to a control gate of the non-volatile memory transistor; and applying a voltage having a second polarity to a source of the non-volatile memory transistor and to the first well region.

15. The method of claim 14, wherein the step of causing electrons to be transferred from the first well region to the floating gate comprises the step of applying a voltage having the first polarity to the second well region.

16. The method of claim 13, wherein the step of causing electrons to be transferred from the floating gate through the access transistor further comprises the steps of:

applying a voltage having a first polarity to an access gate of the access transistor and to a drain of the access transistor; and applying a voltage having a second polarity, opposite the first polarity, to a control gate of the non-volatile memory transistor.

17. The method of claim 16, wherein the step of causing electrons to be transferred from the floating gate through the access transistor further comprises the steps of:

applying a ground voltage to the first well region; and applying a $V_{cc}$ supply voltage to the second well region.

18. The method of claim 13, further comprising the step of reading the flash EEPROM cell by:

applying a $V_{cc}$ supply voltage to a control gate of the non-volatile memory transistor;

applying the $V_{cc}$ supply voltage to an access gate of the access transistor;

applying a first read voltage to a source of the non-volatile memory transistor;

applying a second read voltage to a drain of the access transistor; and monitoring the resulting current through the non-volatile memory transistor and the access transistor.

19. The method of claim 13, further comprising the step of inhibiting the transfer of electrons from the floating gate through the access transistor by applying a ground voltage to a drain of the access transistor.

* * * * *